United States Patent [19]
Conan

[11] Patent Number: 5,291,448
[45] Date of Patent: Mar. 1, 1994

[54] ZONE-SEGREGATED CIRCUIT FOR THE TESTING OF ELECTRICALLY PROGRAMMABLE MEMORY CELLS

[75] Inventor: Bertrand Conan, Aix en Provence, France

[73] Assignee: SGS-Thomson Microelectronics, S.A., Gentilly, France

[21] Appl. No.: 718,627

[22] Filed: Jun. 21, 1991

[30] Foreign Application Priority Data

Jun. 21, 1990 [FR] France ................. 90 07792

[51] Int. Cl.$^5$ ............................................. G11C 29/00
[52] U.S. Cl. ..................................... 365/201; 371/21.1; 365/63
[58] Field of Search ........................ 365/201, 63, 51; 371/21.1

[56] References Cited

U.S. PATENT DOCUMENTS

5,157,627  10/1992  Gheewala ....................... 365/201 X

FOREIGN PATENT DOCUMENTS

0318363  5/1989  European Pat. Off. .
175289  7/1988  Japan ............................ 365/201
2156581  10/1985  United Kingdom .
8100154  1/1981  World Int. Prop. O. .
9003033  3/1990  World Int. Prop. O. .

OTHER PUBLICATIONS

Gastaldi et al, "A 1-Mbit CMOS EPROM with Enhanced Verification", *IEEE Journal of Solid-State Circuits*, vol. 23, No. 5, pp. 1150-1156, (Oct. 1988).

*Primary Examiner*—Benny Lee

[57] ABSTRACT

To reduce the number of connections in an electrically programmable memory circuit, a device for the testing of the memory cells is proposed. The test consists in the reading of the current that goes through the cells to which access is had in reading mode. The testing device no longer uses specific testing connections between the cells and the corresponding input/output pins but the operational connections of the reading mode, between the reading amplifiers and the input/output buffers, in short-circuiting the input and the output of the reading amplifiers located in a zone close to the memory cells and the input/output buffers located on the peripheral zone, close to the input/output pins. The means to short-circuit the amplifiers and the buffers are respectively located in a zone close to the memory cells, and in the peripheral zone.

20 Claims, 2 Drawing Sheets

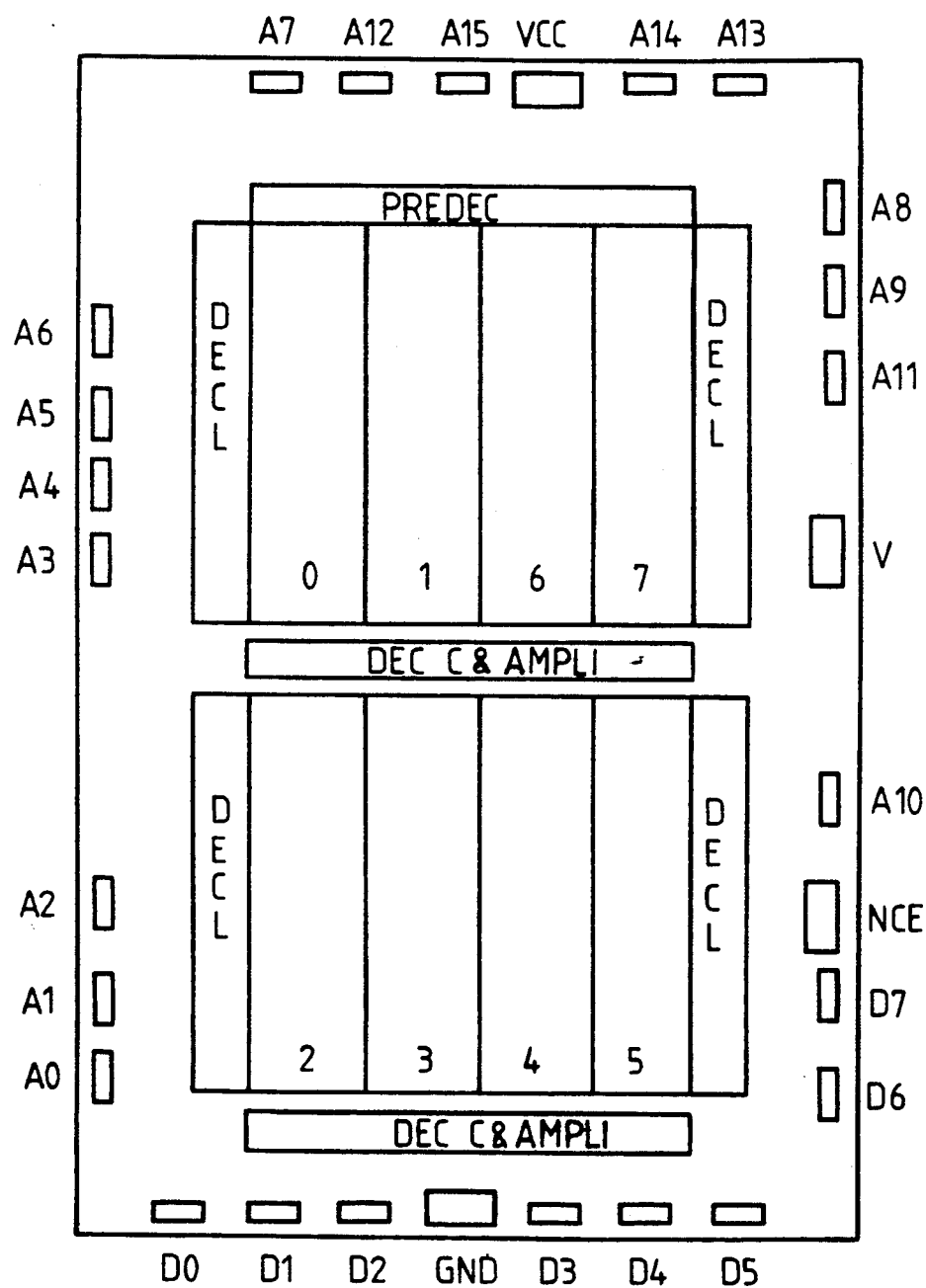
FIG_1
PRIOR ART

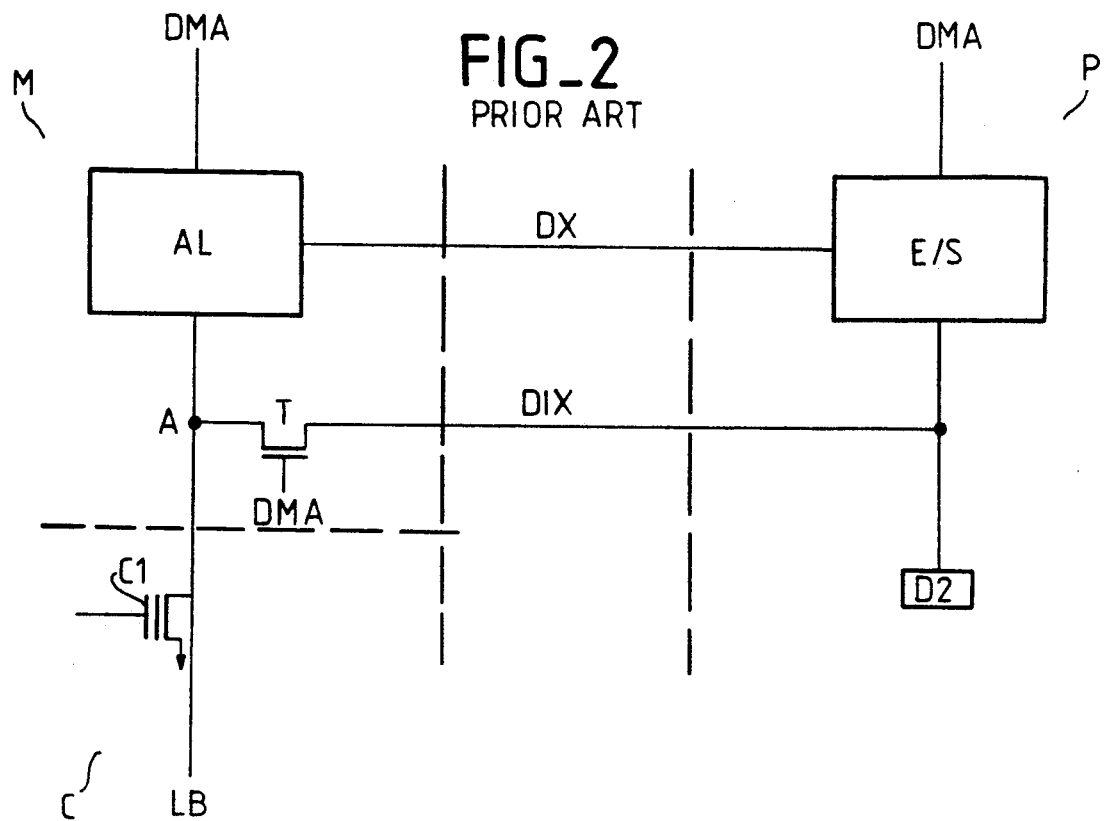
FIG_2 PRIOR ART
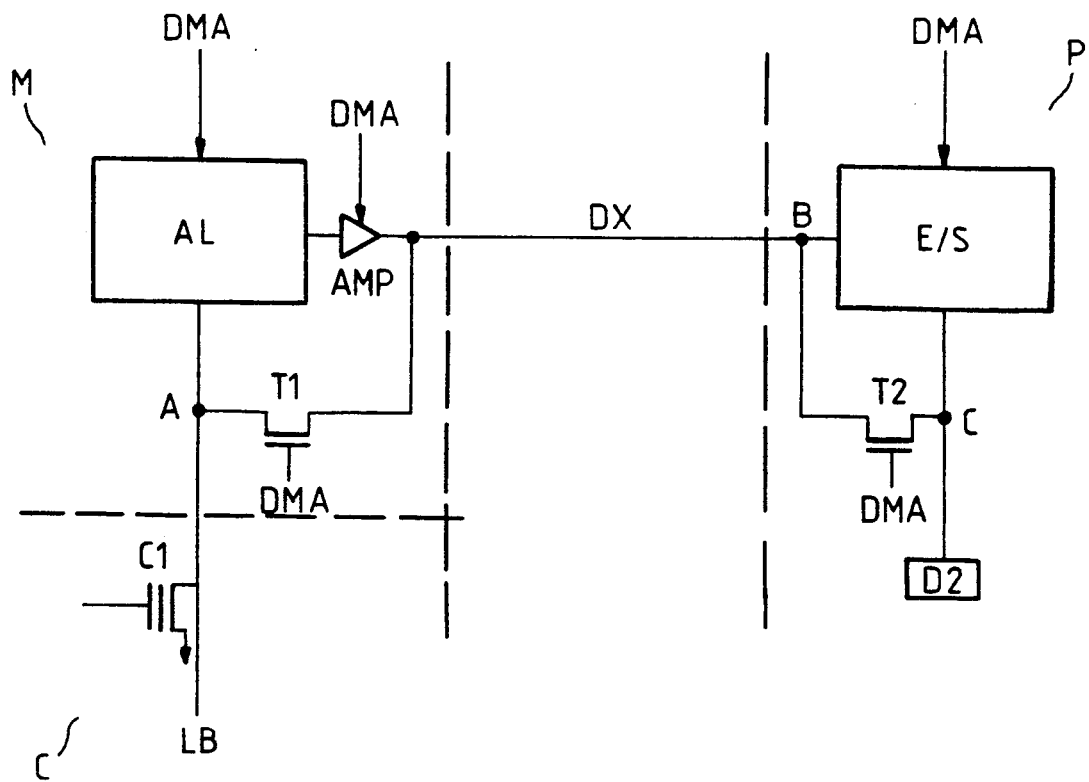
FIG_3

ZONE-SEGREGATED CIRCUIT FOR THE TESTING OF ELECTRICALLY PROGRAMMABLE MEMORY CELLS

BACKGROUND OF THE INVENTION

1. Field of the Invention

The invention relates to the testing of electrically programmable memory (EPROM and EEPROM) cells.

Such cells are each formed by a floating gate transistor, the control gate of which is connected to a word line, the drain to a bit line and the source to a reference potential that is generally the electrical ground of the circuit.

The cells are placed in a matrix arrangement: a word line is connected to the control gates of all the transistors of one line. A bit line is connected to the drain of all the transistors of one column.

To facilitate the addressing operation, the memory array is generally divided, for example to form sub-groups of bit lines. The column decoding (of the bit lines) is then done in two phases. These are: the decoding of a bit line in each sub-group and the decoding of the sub-group. This set of sub-groups forms a group that corresponds to a data element or again to a data bit. For this group, there will be only one reading amplifier. There could be one writing amplifier per sub-group, this amplifier being selected by the decoding of the sub-group.

In practice, the memories are organized in information words of a certain length: 4, 8, 16, 32 data bits. We then have several groups of bit lines as defined here above. A group of bit lines corresponds to the bits having a place value i in the information word. There are many groups as there are bits in the information word.

Furthermore, it is sought to optimize the occupancy of the surface of the semiconductor circuit. Thus, for example, for an eight-bit memory, namely a memory in which an information word is given on eight bits with place values 0, 1, ..., 7 corresponding to input/output pins of data D0, D1, ..., D7 of the memory, eight groups of bit lines are defined: a first group corresponding to the bits with the place value 0 (D0), ..., an eighth group corresponding to the bits with the place value 7 (D7). And, in this example, there are eight reading amplifiers, one per group.

It is also possible to define, for example, two groups of word lines: a first group corresponding to the groups 0, 1, 6 and 7 of bit lines D0, D1, D6 and D7, a second group corresponding to the groups 2, 3, 4 and 5 of bit lines D2, D3, D4 and D5. Such a choice depends on the physical structure chosen for the circuit and on its optimization.

The reading of a memory word will lead to the selection of a word line in each group of word lines and to the selection of a bit line in each group of bit lines. All the data bits of the information word are then given in parallel by the reading amplifiers associated with the groups of bit lines.

Topographically, as can be seen in FIG.1, a division such as this enables an organization in two half-arrays, the bit lines being taken vertically in the example and the word lines being taken horizontally. The upper half-array corresponds to the first group of word lines with the groups 0, 1, 6 and 7 of bit lines. The lower half-array corresponds to the second group of word lines with the groups 2, 3, 4 and 5 of bit lines. In the example, the second group of words corresponds to a simple placing of the first group in parallel. The pre-decoder (PREDEC) is preferably just above and on the border of the upper half-array. The word line decoder (DEC L) of each half-array is placed on the border of the vertical sides of the corresponding half-array. The column decoders (DEC C), namely the decoders of the bit lines, of the upper half-array, and the corresponding reading and writing amplifiers (AMPLI) are located between the two half-arrays. Those of the lower half-map are located beneath this half-array, on the border.

On the periphery of the memory circuit, there are the memory input/output and memory control pins with the associated buffers. Thus, at the top and on the vertical sides, there are input pins of the address bus, in the example A0–A15 with the associated input buffers. They are thus close to the different decoders. There are also the pins for ground (GND) and the Vcc and Vpp supplies and for the selection of the memory circuit NCE.

At the bottom, and somewhat to the right, there are the data (D0–D7) input/output pins, and the ground of the circuit GND. In the example, D0 is to the far left, D5 to the far right and D6 and D7 at the bottom of the straight vertical side. The interconnections of the upper half-map with the corresponding input/output pins D0, D1, D6 and D7 are thus optimized.

The interconnections to be made are numerous, between the decoders, the pre-decoder and the input buffers of the address bus, the amplifiers and the input/output buffers of the data bus. Thus, if the memory array proper is called the "core", the decoders and amplifiers that give access to the memory array are called the "middle" and the buffers and the input/output pins of the circuit are called the "periphery", then there are numerous interconnections to be made between the middle and the periphery, it being furthermore known that these interconnections cannot go through the "core". These interconnections take up a great deal of space with respect to the core, which it is why it is always sought to reduce their number. It is also sought to position the different circuits so as to optimise the length of the interconnections.

2. Description of the Prior Art

Now, for the requirements of testing electrically programmable memory cells, for which it is sought to read not the binary content 0 or 1 depending on whether they are programmed or not but rather their capacity to conduct current before or after their programming, additional connections are used to enable the measurement of the current that passes into the cell, when access is obtained to it in reading mode. The testing circuit generally used is shown in FIG. 2, where core, middle and peripheral portions of the chip are indicated as C, M, and P, respectively.

Indeed, in reading mode, the drain of the selected cell C1, namely in fact the corresponding bit line LB, is connected to the input of a reading amplifier AL which will inject current into the cell. Depending on whether the current goes into the cell or not, the amplifier delivers a high or low logic level at its output. A connection DX connects the output of the reading amplifier to the input of the corresponding input/output buffer (I/O) which is itself connected at output to a corresponding input/output pin, for example D2.

In testing, the cell also is read, but it is sought to read the current that goes through it and not the binary logic level delivered at output of the reading amplifier. An additional connection DIX is then used. This additional connection DIX connects the input/output pin D2 to the drain of the cell C1 by a transistor T used as a switch (and gated by signal DMA described below), its source being connected to the connection DIX and its drain through node A to the drain of the cell. This transistor is topographically beside the amplifier, namely in the middle zone. When the circuit is in testing mode, a signal DMA puts the input of the reading amplifier and the output of the input/output buffer in a high impedance state, and makes the transistor/switch T conductive. Thus, if an external voltage is imposed on the pin D2, it is possible to read the current that flows into the cell. This current is disturbed neither by the input/output buffer nor by the amplifier since these two elements have been placed in a state of high impedance.

Having a test circuit such as this amounts to doubling the interconnections DX: the number of interconnections between the reading amplifier and the input/output buffer is doubled. This is a major drawback as has already been seen in the optimization of the size of the circuit, since the number of connections directly and substantially affects the size of the circuit.

SUMMARY OF THE INVENTION

An object of the invention is another test circuit for the reading of the current of the cells, that enables a reduction in the total number of connections of the circuit.

Indeed, in the invention, it is observed that it is less costly in terms of space to add transistors to the middle or to the periphery than to add connections between the two zones, the middle and the periphery.

An object of the invention, therefore, is a device for the testing of electrically programmable memory cells of a circuit comprising, for each data input/output pin, an associated input/output buffer in a peripheral zone of the circuit and an associated reading amplifier in a middle zone of the circuit, close to the array of the memory cells, the input of the input/output buffer being connected to the output of the reading amplifier by a connection DX and the output of the input/output buffer being connected to the input/output pin, the input of the reading amplifier being connected at a node A to a bit line corresponding to a cell selected in reading mode, wherein said device includes means to short-circuit the input and the output of the reading amplifier in testing mode, these means being topographically located in the middle zone of the circuit, and means to short-circuit the input and the output of the input/output buffer in testing mode, these means being topographically located in the peripheral zone of the circuit.

BRIEF DESCRIPTION OF THE DRAWINGS

Other advantages and features of the invention are given in the following description, made by way of an example that in no way restricts the scope of the invention and made with reference to the appended drawings, of which:

FIG.1 shows an example of a topography of a memory as described already;

FIG.2 shows an electrical diagram of a known testing circuit;

FIG.3 shows an electrical diagram of a testing circuit according to the invention.

DETAILED DESCRIPTION OF THE INVENTION

FIG.3 shows a testing circuit according to the invention.

The input of the reading amplifier AL is connected by the node A to the drain of a selected memory cell C1 (that is, in fact, to the selected bit line LB). The output of the reading amplifier AL is connected to the input of a three-state-output amplifier AMP (namely with a high impedance state). The output of this amplifier AMP is connected to the input of an input/output buffer, referenced I/O, by a connection DX.

A first transistor T1 is used as a switch between the node A, at the input of the reading amplifier, and the output of the three-state-output amplifier AMP: the drain of the transistor T1 is connected to the point A and the source to the output of the amplifier AMP. Transistor T1 is controlled at its gate by a test mode signal DMA.

A second transistor T2 is used as a switch between the input of the buffer I/O and its output: its drain is connected to the input of the buffer I/O at the point B, and its source is connected to the output of the buffer I/O at the point C. Transistor T2 is also controlled at its gate by the signal DMA.

The placing of the reading amplifier, the three-state-output amplifier and the output of the input/output buffer in the high impedance state is controlled by the test mode signal DMA.

The operation is then as follows: when it goes into test mode, the signal DMA makes the two transistors conductive and places the outputs of the three-state-output amplifier AMP and of the input/output buffer in a state of high impedance. The signal DMA also places the input of the reading amplifier in a state of high impedance, to prevent the current from being injected into the cell, which would disturb the test.

In fact, the reading amplifier, in a standard way, includes an output amplifier (not shown), the structure of which can be modified in the invention, to enable it to be placed in high impedance upon a command DMA. In the example, it has been preferred to add a three-state-output amplifier AMP to the output of the reading amplifier.

In test mode, if a voltage is applied to the pin D2, a current will flow in the selected cell and go into the connection DX, the reading amplifier with the amplifier AMP and the input/output buffer being short-circuited. It is possible to measure the current at the pin D2.

The first transistor T1 and the three-state-output amplifier AMP are made in the middle zone M, near the reading amplifier.

The second transistor T2 is, for its part, made in the peripheral zone P, close to the buffer I/O.

Thus, additional circuitry is added but, as a compensation, there is henceforth only one connection, the operational connection DX: the connection DIX of FIG.2 is eliminated.

Thus, by adding as many additional elements of circuitry, according to the invention, in the middle and peripheral zones as there are input/output pins Di, the same number of inter-zone connections dedicated to the test are eliminated. And, finally, it is possible to reduce the area of the memory circuit.

Furthermore, since there are fewer connections, the reliability of the circuit is increased.

What is claimed is:

1. A device for the testing of electrically programmable memory cells of an integrated circuit comprising one or more memory arrays, each memory array including multiple bit lines, at a core thereof, a middle zone adjacent to said core, a peripheral portion adjacent to said middle zone but not adjacent to said core, and a plurality of
- an associated input/output buffer, located in the peripheral zone of the circuit, and an associated reading amplifier in the middle zone of the circuit,
- said input/output buffer having an input connected to an output of said reading amplifier, and having an output connected to said respective input/output pin,
- said reading amplifier having an input operatively connected to a selectable one of the bit lines,
- first means connected to short-circuit said input and output of said reading amplifier when commanded by a testing mode signal, these means being topographically located in the middle zone of the circuit, and
- second means connected to short-circuit said input and output of said input/output buffer when commanded by said testing mode signal, these means being topographically located in the peripheral zone of the circuit.

2. A testing device according to claim 1, wherein said first means includes a three-state-output amplifier connected to the output of the reading amplifier, said three-state-output amplifier being connected and configured to provide a high impedance output when commanded by said testing mode signal, and a first transistor having a drain connected to a selectable one of the bit lines, a source connected to said output of said three-state-output amplifier, and a gate connected to be controlled by said testing mode signal.

3. A testing device according to claim 2, wherein said second means includes a second transistor having a drain connected to said input of said input/output buffer, a source connected to said output of said input/output buffer, and a gate connected to be controlled by said testing mode signal.

4. A testing device according to claim 1, wherein said second means includes a second transistor having a drain connected to said input of said input/output buffer, a source connected to said output of said input/output buffer, and a gate connected to be controlled by said testing mode signal.

5. A memory circuit comprising
- a plurality of electrically programmable memory cells, each said cell being connected to one of a plurality of bit lines of a memory array in a core zone thereof,
- a plurality of decoders and amplifiers operatively coupled to said memory array to give access thereto, said plurality of decoders and amplifiers being located in a middle zone of said memory circuit, at least a part of said middle zone being adjacent to said core zone,
- a plurality of input/output buffers and a plurality of input/output nodes located in a peripheral zone of said memory circuit, at least a part of said peripheral zone being adjacent to said middle zone and none of said peripheral zone is adjacent to said core zone,
- each said input/output buffer having an input connected to a respective associated one of said amplifiers and having an output connected to a respective associated one of said input/output nodes,
- a plurality of first test circuit components topographically located in said middle zone, and a plurality of second test circuit components topographically located in said peripheral zone, each said first test circuit component being connected between an input and an output of a respective one of said amplifiers, and each said second test circuit component being connected between the input and the output of a respective one of said input/output buffers, and
- circuitry for providing a test mode signal, when a test mode is requested, to each of said first test circuit components to short-circuit the corresponding amplifiers, and to each of said second test circuit components to short-circuit the corresponding input/output buffers.

6. A memory circuit in accordance with claim 5, wherein each said first test circuit component comprises a first transistor having a conductance path and a gate, with the conductance path being connected between the input and the output of the respective amplifier, and the gate being connected to said test mode signal providing circuitry.

7. A memory circuit in accordance with claim 5
- wherein each said first test circuit component comprises a first transistor having a conductance path and a gate,
- and wherein each said amplifier comprises a reading amplifier and a three-state-output amplifier, an input of each said three-state-output amplifier being connected to an output of the respective reading amplifier, each said conductance path being connected between the input of the respective reading amplifier and the output of the respective three-state-output amplifier,
- wherein said test mode signal is connected to each said gate,
- wherein said test mode signal, is connected to each said three-state-output amplifier, to place said respective three-state-output amplifier thereof in a state of high impedance in response to the test mode signal,
- and wherein said input of each respective input/output buffer is connected to the output of the respective three-state-output amplifier.

8. A memory circuit in accordance with claim 7 wherein
- each said second test circuit component comprises a second transistor having a conductance path and a gate, with the conductance path of each second transistor being connected between the input and the output of the respective input/output buffer, and the gate of each second transistor being connected to said test mode signal providing circuitry.
- wherein said test mode signal providing circuitry is connected to each said input/output buffer to place each said input/output buffer in a high impedance state in response to said test mode signal; and
- wherein said test mode signal providing circuitry is connected to each said reading amplifier to place each said reading amplifier in a high impedance state in response to said test mode signal.

9. A memory circuit in accordance with claim 5 wherein each said second test circuit component comprises a transistor having a conductance path and a gate, with the conductance path being connected between the input and the output of the respective input/output buffer, and the gate being connected to said test mode signal providing circuitry.

10. A memory circuit in accordance with claim 5, wherein said input/output nodes are input/output pins.

11. A memory circuit in accordance with claim 5 wherein the input of each amplifier is connected to a respective bit line of the memory array.

12. A memory circuit in accordance with claim 5 wherein the input of each respective input/output buffer is connected to the output of said respective associated amplifier by a signal connector.

13. A memory circuit in accordance with claim 5 wherein each said first test circuit component comprises a first transistor having a drain, a source and a gate, with the drain of each said first transistor being connected to the input of the respective amplifier, the source of each said first transistor being connected to the output of the respective amplifier, and the gate of each said first transistor being connected to said test mode signal providing circuitry.

14. A memory circuit in accordance with claim 13 wherein each said second test circuit component comprises a second transistor having a source, a drain, and a gate, with the drain of each said second transistor being connected to the input of the respective input/output buffer, the source of each said second transistor being connected to the output of the respective input/output buffer, and the gate of each said second transistor being connected to said test mode signal providing circuitry.

15. A memory circuit in accordance with claim 5 wherein each said second test circuit component comprises a transistor having a conductance path and a gate, with the conductance path being connected between the input and the output of the respective input/output buffer, and the gate being connected to said test mode signal providing circuitry.

16. A memory circuit in accordance with claim 5 wherein each said first test circuit component comprises a first transistor having a drain, a source, and a gate, and wherein each said amplifier comprises a reading amplifier and a three-state-output amplifier, an output of each said reading amplifier being connected to an input of the respective three-state-output amplifier, wherein said test mode signal is connected to said gate of each said first transistor, and wherein said input of each said input/output buffer is connected to an output of said respective three-state-output amplifier associated with said respective input/output buffer, wherein each said second test circuit component comprises a second transistor having a drain, a source, and a gate, with said drain of each said second transistor being connected to said input of said respective input/output buffer, said source of each said second transistor being connected to said output of said respective input/output buffer, and said gate of each said second transistor being connected to said test mode signal providing circuitry.

17. A memory circuit in accordance with claim 5 wherein each of said amplifiers is located close to said array of memory cells.

18. A memory circuit in accordance with claim 5 wherein said test mode signal providing circuitry is connected to each said amplifier to place each said amplifier in a high impedance state in response to said test mode signal.

19. A memory circuit in accordance with claim 5 wherein said test mode signal providing circuitry is connected to each said input/output buffer to place each said input/output buffer in a high impedance state in response to said test mode signal.

20. A memory circuit in accordance with claim 19 wherein said test mode signal providing circuitry is connected to each said amplifier to place each said amplifier in a high impedance state in response to said test mode signal.

* * * * *